United States Patent [19]

Yonehara et al.

[11] Patent Number: 4,656,963

[45] Date of Patent: Apr. 14, 1987

[54] METHOD AND APPARATUS FOR FORMING AN EXTREMELY THIN FILM ON THE SURFACE OF AN OBJECT

[76] Inventors: Takashi Yonehara, 26-3, Ontamachi 5-chome, Higashimurayama-shi, Tokyo; Kanji Hayashi, 10-2, Omorihoncho 2-chome, Ota-ku, Tokyo, both of Japan

[21] Appl. No.: 745,876

[22] Filed: Jun. 18, 1985

Related U.S. Application Data

[62] Division of Ser. No. 412,988, Aug. 30, 1982, Pat. No. 4,605,574.

[30] Foreign Application Priority Data

| | | | |
|---|---|---|---|
| Sep. 14, 1981 | [JP] | Japan | 56-143817 |
| Oct. 6, 1981 | [JP] | Japan | 56-159251 |
| Nov. 5, 1981 | [JP] | Japan | 56-164354[U] |
| Nov. 16, 1981 | [JP] | Japan | 56-169468[U] |
| Dec. 12, 1981 | [JP] | Japan | 56-183102[U] |
| Mar. 17, 1982 | [JP] | Japan | 57-40842 |
| Apr. 12, 1982 | [JP] | Japan | 57-51830[U] |
| Apr. 12, 1982 | [JP] | Japan | 57-51831[U] |

[51] Int. Cl.[4] .............................................. B05B 15/12

[52] U.S. Cl. .................................... 118/326; 118/325; 118/DIG. 7

[58] Field of Search .................. 118/326, DIG. 7, 325

[56] References Cited

U.S. PATENT DOCUMENTS

| | | | |
|---|---|---|---|
| 2,736,289 | 2/1956 | Allen | 118/326 X |
| 3,382,845 | 5/1968 | Jester | 118/326 X |
| 3,814,322 | 6/1974 | Waldrum | 118/326 X |
| 4,290,384 | 9/1981 | Ausschnitt et al. | 118/722 |
| 4,309,456 | 1/1982 | Lock | 118/326 X |

*Primary Examiner*—Shrive P. Beck
*Attorney, Agent, or Firm*—McGlew and Tuttle

[57] ABSTRACT

The present invention relates to a method for forming a uniform, extremely thin film on the surface of plastics molded articles, films, sheets, synthetic paper, fibers, metal, and other objects, the film containing an anti-static agent, anti-fogging agent, anti-corrosive agent, mildewproofing agent, and the like. According to the method of the present invention, a homogenous solution or emulsion is prepared by dissolving a surfactant and agents in a solvent such as water with the aid of ultrasonic waves, and the solution is made into aerosol of fine particles by means of cavitation. The aerosol is brought into contact with an object, whereby the fine particles of aerosol are deposited on the object and a thin film of the solution is formed on the surface of the object due to the difference in surface tension between the surfactant and the object. After evaporation of the solvent, the agents are left on the surface of the object in the form of an extremely thin film. The present invention also relates to apparatuses for producing such aerosol, selecting aerosol particles, and bringing the aerosol into contact with the surface of an object.

7 Claims, 35 Drawing Figures

METHOD AND APPARATUS FOR FORMING AN EXTREMELY THIN FILM ON THE SURFACE OF AN OBJECT

This is a division of application Ser. No. 412,988 filed Aug. 30, 1982 now U.S. Pat. No. 4,605,574.

FIELD AND BACKGROUND OF THE INVENTION

The present invention relates to a method and apparatus for forming an extremely thin film for preventing static electricity, fogging, corrosion, mildew, etc. on the surface of magnetic tape, magnetic disks, semiconductor devices, records, plastics products, photographic film, metal products, clothing, etc.

It has been a common practice to incorporate an anti-static agent and bonding agent such as polyurethane or polyvinyl acetate into the magnetic coating for magnetic tape in order to protect the magnetic tape from static charge that causes noise and misoperation. This anti-static agent, however, adversely affects the adhesion of the magnetic coating to the tape, when used excessively.

It is also a practice to incorporate an anti-static agent directly into the tape. This method, however, is disadvantageous in that production cost is high, anti-static performance is not uniform, and the anti-static agent bleeds to the surface of the tape.

In order to eliminate static build-up that occurs on plastics molded items immediately after demolding, the molded items are dipped in or sprayed with a solution of anti-static agent so that an anti-static film is formed on the surface of the molded items. These methods encounter some disadvantages. That is, dipping requires the step of removing (drying) excess solution from the molded items after dipping. Making a uniform and firm-bonding film by dipping is difficult. The molded items might become irregular in gloss after dipping. On the other hand, spraying requires an additional step for spreading the sprayed solution, and this tends to cause static build-up under certain circumstances.

Plastics films and sheets are easy to generate static charge. Charged films or sheets cause ink to scatter during printing, and cling to the machine or become irregular during seal-cutting operation. The conventional apparatus for eliminating static charge from films and sheets is elaborate, and one that uses corona discharge encounters danger of fire due to high discharge voltage and gives off ozone which is harmful to human bodies. In addition, such an apparatus is poor in durability.

The minute irregularities on the mirror-finished surface of a plastics molded item are eliminated by forming a surface improving film on the surface. Such a film, however, does not spread uniformly along the irregularities, but tends to agglomerate in many places. This is attributable to the film thickness and the surface tension of the film greater than that of the plastics.

In the case of plastics bags, it has been a practice to incorporate an anti-static agent into the raw material or to apply an anti-static agent onto the inside of the finished bags so as to prevent the bags from becoming charged. The bags thus prepared are sticky and difficult to open, and this is a great hindrance in the case where the bags are filled with articles at high speeds using an automatic packaging machine. In addition, the anti-static agent applied to the inside of the bag adversely affects the contents of the bag. Thus this method is not suitable for bags for packing foods and drugs. Moreover, the sticky anti-static agent which has bled to the surface of the bag collects powder or particles of the contents, inhibiting the mouth from complete heat sealing. In another method for eliminating static charge, the finished bags are dipped in a solution of anti-static agent so that a layer of anti-static agent is formed on the outer surface of the bag. This method is not effective for preventing static build-up inside the bag because a continuous homogeneous layer is not formed.

Static charge is also deleterious to semiconductor devices such as IC and LSI. Preferably, in the case of MOS-type IC, the gate is broken instantaneously even by a small quantity of static charge caused by friction with other objects during transportation or by static charge accumulated in a human body. In the case of the latest 16-kilobit or 64-kilobit high-performance LSI which is designed to operate on 0.2 voltage, the performance is easily impaired and the circuits are broken by static electricity. Static charge harmful to semiconductor devices is generated when they are rubbed on the plastics magazine stick used as the transportation case. (The magazine stick used to be made of metal. It is earthed during use. Metal magazine sticks are inconvenient because the semiconductor devices in them are not visible from outside. For this reason, they have been replaced by plastics ones.) In addition, the fact that semiconductor devices themselves are insulated and coated with plastics helps generate static electricity through friction. For instance, ceramic DIP's packed in a plastics tube generate a static charge of 700 V; ceramic DIP's arranged on a plastics tray generate a static charge of 4000 V; ceramic DIP's packaged in foamed polystyrene generate a static charge of 5000 V; IC's deprived of "air cap" (cushioning material) generate a static charge of 20,000 V; IC's packed in foamed plastics generate a static charge of 11,000 V; and IS's taken out of the packing material for repair generate a static charge of 6000 V. Countermeasures for preventing static build-up are taken for semiconductor devices in the respective stages of production, storage, transportation, mounting on the apparatus, and operation of the apparatus. Such countermeasures include earthing, bonding, humidification, use of conductive materials, use of anti-static agents, use of static eliminators, wearing of anti-static working clothes and shoes, use of conductive floors, and suppression of discharge. These countermeasures have to be taken in each stage of production, storage, and transportation, and their effect is not necessarily complete. As another countermeasure for static charge, the protective container of the semiconductor device is made conductive. But this does not completely prevent static damage of semiconductor devices because instantaneous discharge and inductive charge are induced by the conductivity.

SUMMARY OF THE INVENTION

It is the first object of this invention to provide a method for forming an extremely thin film uniformly on the surface of an object.

It is the second object of this invention to provide a method for forming a uniform, extremely thin film which is resistant to abrasion and peeling on the surface of an object.

It is the third object of this invention to provide a method for forming on the surface of an object a coating film which is thinner than the wavelength of visible light and does not change the surface color of the coated object.

It is the fourth object of this invention to provide an apparatus which accomplishes the above-mentioned objects.

For an understanding of the principles of the invention, reference is made to the following description of typical embodiments thereof as illustrated in the accompanying drawings.

DESCRIPTION OF THE PREFERRED EMBODIMENTS

Figure 3:
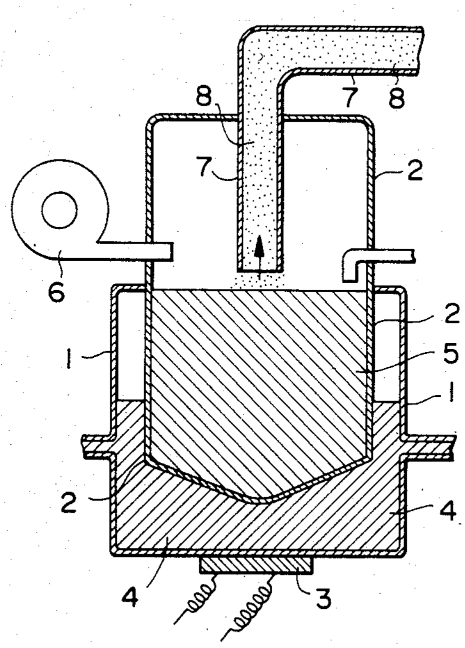
FIG. 3 is a sectional view of an aersol generating apparatus in accordance with the invention.

Reference is now made to the accompanying drawings wherein the same reference numerals designate the same or similar parts.

Figure 1:
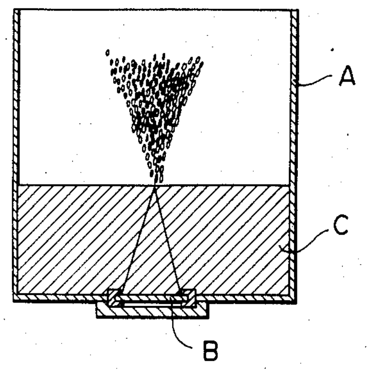
FIG. 1 is a sectional view showing an ultrasonic generator for generating an aerosol.
Figure 2:
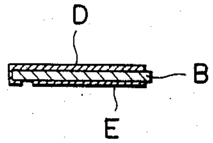
FIG. 2 is a sectional view of a vibrator used to generate ultrasonic waves.

A conventional ultrasonic generator has a structure, as shown in FIG. 1 and FIG. 2, in which a vibrator (B) is supported on the bottom of a container (A) and exposed to a solution (C) held in the container (A). The vibrator (B) is provided on both sides with electrodes (D) and (E) made of silver and the like. The vibrator (B) becomes inoperative when the electrode (D) is corroded by the solution (C) or collects solids from the solution (C). In addition, performance is not necessarily satisfactory because the vibration is absorbed by some kinds of the solution (C).

EXAMPLE 1

FIG. 3 shows the aerosol generating apparatus used in this invention. There are shown an external container 1, an internal container 2 placed in the external container 1, a vibrator 3 equipped at the bottom of the external container 1, and a transmitting medium 4 in the external container 1. The transmitting medium 4 is replenished from outside, continuously. Solution 5 placed in the internal container 2 is an aqueous solution containing small quantities of surfactant, anti-static agent, and anti-fogging agent. There are also shown a blower 6 which supplies air into the internal container 2, and a duct 7 which introduces the aerosol from the top of the internal container 2 to a place where the aerosol is used. The vibrator 3 is actuated electrically so as to cause cavitation in the internal container 2, and this cavitation causes aerosol 8 to be produced on the surface of the solution 5. The aerosol 8 is made up of extremely fine, uniform particles which become charged easily. The aerosol 8 is fed by the blower 6 to a point of use through the duct 7.

Figure 4:
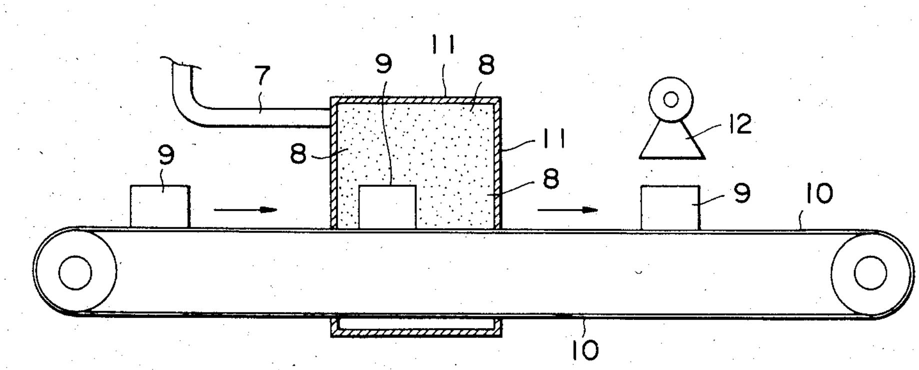
FIG. 4 is a side view of an apparatus used to achieve a method of the invention.

FIG. 4 shows a method for treating an object 9 such as a plastics molded item with the aerosol. The duct 7 is connected to a chamber 11 at the middle of a conveyor 10. The chamber 11 is kept sealed by air curtain or suspending sheets which permit the object 9 to pass. On entrance in the chamber 11 by the conveyor 10, the object 9 comes into contact with the aerosol 8 filled in the chamber 11. The particles of the aerosol produced with the aid of ultrasonic waves and surfactant are so small that they are easily attracted to the surface of the object 9 (plastics molded item) which becomes charged easily. The static charge on the surface of the object is neutralized and the particles of the aerosol spread in the form of a thin film on the surface of the object. The surfactant helps the aerosol particles to spread. On leaving the chamber 11, the treated object is exposed to hot air produced by a heater 12. The solvent (water) is removed by evaporation, and the anti-static agent and other agents are left in the form of an extremely thin film on the surface of the object 9. This film is so thin that adhesion to the object is very strong and the agents keep their effects for a long time.

Figure 5A:
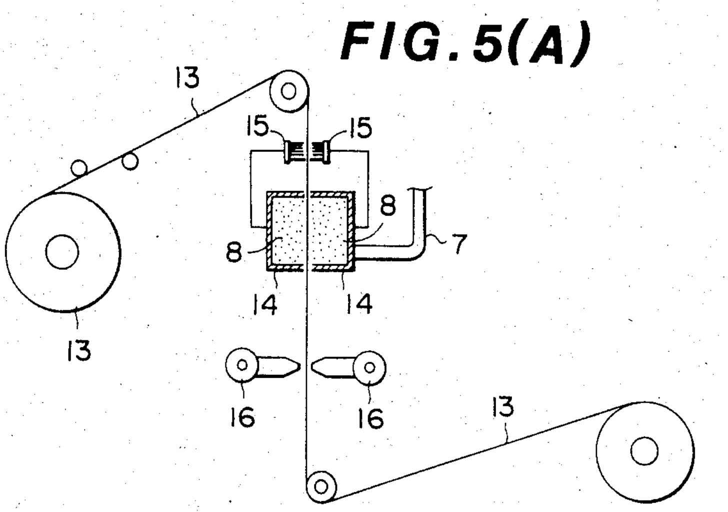
FIGS. 5(A)(B) and (C) are schematic representations showing method of treating plastic film or sheets according to the invention.
Figure 5B:
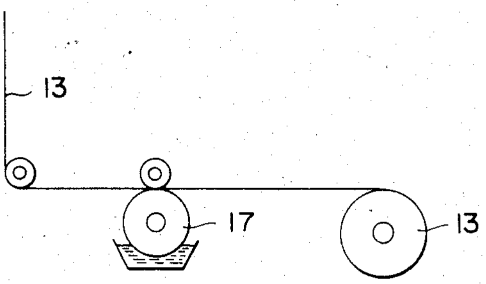
Figure 5C:
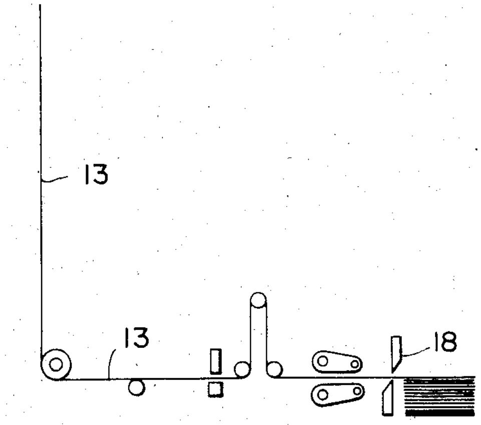

FIG. 5(A) illustrates a method for treating a plastics film or sheet 13 with the aerosol 8. According to this method, the film or sheet 13 is passed through a chamber 14 on its take-up route. The duct 7 is connected to the chamber 14 so that the aerosol 8 is introduced into the chamber 14. Prior to entrance in the chamber 14, the film or sheet 13 is rubbed with a brush 15 for static build-up on both sides thereof. The brush 15 is electrically connected to the chamber 14 so that the aerosol 8 in the chamber 14 is charged. When the film or sheet is negatively charged by the brush 15, the aerosol 8 in the chamber 14 is positively charged. Thus the fine particles of the aerosol 8 are attracted to both sides of the film or sheet 13 with great force. The film or sheet 13 emerging from the chamber 14 is dried by blowers 16. As in the above-mentioned example, the solvent is removed by evaporation and the agents such as anti-static agent are left in the form of an extremely thin film on the surface of the film or sheet 13. FIG. 5(B) shows the film or sheet 13, with an extremely thin film formed on both sides as above mentioned, being printed by an ink roll 17. FIG. 5(C) shows the film or sheet 13, with an extremely thin film formed on both sides, being heat-sealed and fusion-cut to size by a seal cutter 18. The film or sheet 13 does not become charged during printing or seal-cutting, and can be handled easily without a static eliminator. In this example, the brush is connected to the chamber 14, but this connection is not necessarily required. Rubbing the film or sheet 13 with the brush 15 generates static charge on both sides which is sufficient to attract the fine aerosol particles. The removal of the solvent may be accomplished by the blowers 16 and pressing rolls in combination or by pressing rolls in place of the blowers 16, depending on the material of the film or sheet 13 or the take-up speed.

Figure 6:
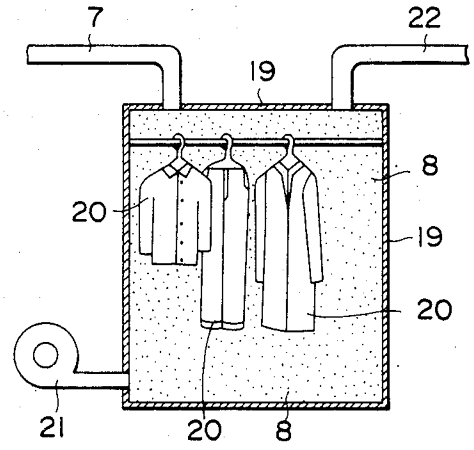
FIG. 6 is a side sectional view of an aerosol treatment chamber in accordance with the invention.

FIG. 6 shows a method for forming an extremely thin film of static agent on clothes 20 in a sealed chamber 19 filled with the aerosol 8 introduced through the duct 7 connected thereto. The solvent is removed by evaporation by hot air blown into the chamber 19 by a heater blower 21. Thus a uniform, extremely thin film of anti-static agent is formed on the clothes 20. Waste gas is discharged from the chamber 19 through an exhaust pipe 22.

In this Example, the solution 5 is composed of a solvent such as water and small quantities of surfactant and other agents. The surfactant helps make extremely small particles of aerosol 8, and the aerosol particles do not agglomerate but form a thin film. The ultrasonically induced cavitation effect helps the agents to dissolve or disperse uniformly in the solvent. The fine aerosol particles 8 suspend in the air for a long time and deposit uniformly on the surface of an object. Moreover, the fine aerosol particles 8 become charged easily and are attracted by any object which is charged easily. This permits agents of low concentrations to be deposited firmly in the form of an extremely thin film. Unlike the conventional method in which additives are incorporated into an object, the method of this invention does not change the properties of an object to be treated.

Figure 7:
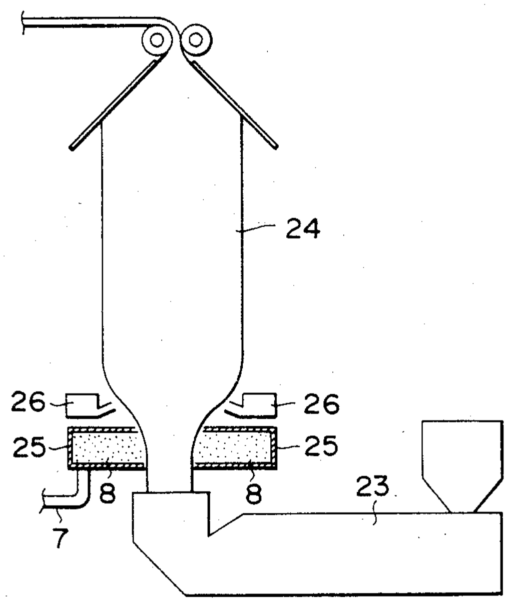
FIG. 7 is a side sectional view of an apparatus for treating a tubular blown film with aerosol in accordance with the invention.
Figure 8:
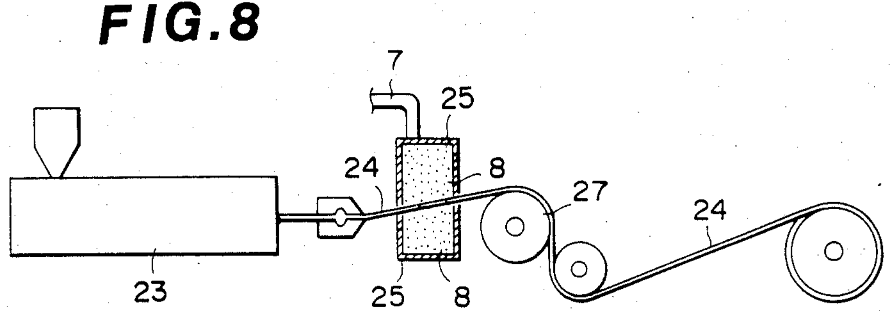
FIG. 8 is a side sectional view of an apparatus for treating extruded film or tape in accordance with the invention.

FIG. 7 and FIG. 8 respectively show a blown tubular film 24 and a T-die flat film 24 being treated with the aerosol 8 immediately after emergence from an extruder 23 while the film is still in the molten state. The film is cooled by a cooling air ring 26 or cooling roll 27 placed after the aerosol chamber 25. As in the above-mentioned examples, the extruded film is coated with an extremely thin film of the agents. When the film 24 is exposed to the aerosol 8, it is still in the molten state and the solute (agents) such as anti-static agent is fixed in the film 24. Therefore, the extremely thin film formed on the film 24 bonds more firmly to the film 24 than the film which is formed after the object has solidified. On contact with the film 24 in molten state, the aerosol 8 is vaporized rapidly. Thus the film is cooled very effectively. The solution for aerosol should preferably be of low concentrations. In the conventional air cooling, the film 24 is cooled slowly and this slow coolling permits molecular orientation and crystallization, which in turn make the resulting film less resistant to longitudinal split. According to the method of this invention, cooling takes place rapidly and the rapid cooling provides amorphous molecular arrangement. Therefore, the resulting film 24 is improved in clarity and strength as compared with the conventional one, and is balanced in the biaxial directions.

Figure 9A:
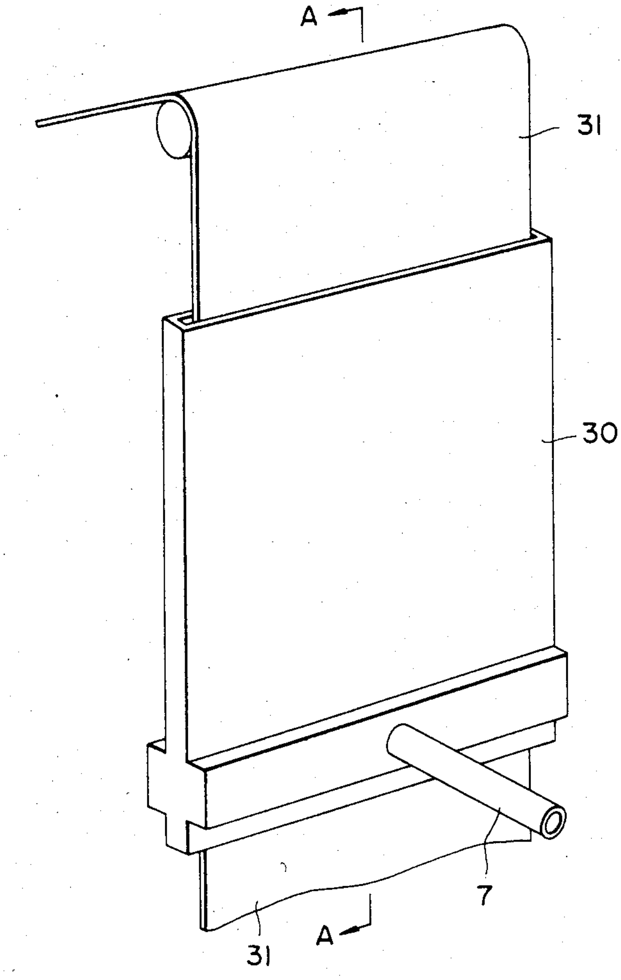
FIGS. 9(A) and 9(B) are respective perspective and side sectional views of another apparatus for forming a thin film on an elongated object in accordance with the invention.
Figure 9B:
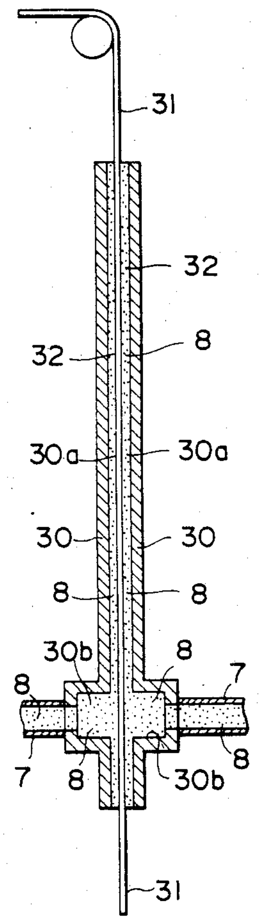

FIG. 9(A) and FIG. 9(B) show a preferred apparatus for forming an extremely thin film of this invention, in the case where a flat object like film or sheet material is to be treated. There is shown a thin square body 30 forming a pair of thin, square hollow spaces **30*a* and a pair of a little wide, square hollow spaces 30*b*. The duct 7 is connected to the hollow space 30*b*. A film 31 travels upwardly through the thin, square body 30 which is filled with the aerosol 8 supplied from the duct 7. As the film 31 moves upwardly, the aerosol 8 rises in the gap 32 formed by the square body 30. Thus the film 31 is exposed to the aerosol 8 for a certain period of time, and the aerosol particles suspending in the gap 32 bounce back from the inside walls of the square body, with the increased chances of contact with the film 31. This permits the aerosol 8 of high concentration to be kept stable in the gap 32, and this in turn permits the aerosol 8 to be supplied to the hollow space 30*b* at a low pressure which does not agglomerate the aerosol particles. The length of the thin, hollow space 30*a* is determined according to the travelling speed of the film 31. The square body 30 should preferably be made of plastics which prevent the aerosol 8 in the hollow space 30*a* from agglomerating because of its good insulation and heat retaining properties. The thin, square body 30 should preferably have a structure in which one side of it can be opened to facilitate the insertion of the film 31 into the spaces 30*a* and 30*b*. The film 31** is not limited in materials; it may be plastics, cloth, paper, synthetic paper, metal, or the like.

Figure 10:
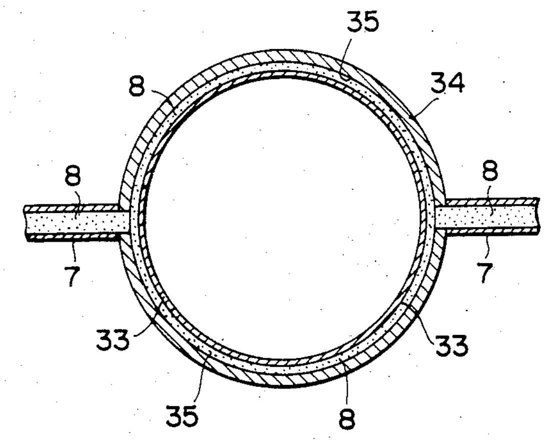
FIG. 10 is a sectional view of an apparatus for forming a thin film on a blown tubular sheet or film in accordance with the invention.

FIG. 10 shows a sectional view of an apparatus for treating a blown tubular film 33 based on the same principle as shown in FIG. 9(A) and 9(B). An annular wall 34 is placed close to the external circumference of a tubular film 33 so that a thin gap 35 is formed in a certain length along the moving direction of the tubular film 33. The gap 35 is filled with the aerosol 8. As in the example shown in FIG. 9(A) and 9(B), it is possible for this apparatus to treat the film with a minimum of aerosol of high concentration at a high speed.

The aerosol may contain agents such as surfactant, anti-static agent, anti-fogging agent, anti-corrosive agent, mildewproofing agent, etc. The surfactant should bring about a great difference in surface tension between the aerosol and the surface of an object so that agglomeration of aerosol particles is inhibited after their deposit on an object. The object to be treated is not limited to plastics molded items.

According to the example mentioned above, a surfactant and other proper agents are dissolved or emulsified uniformly in water or other solvents with the aid of ultrasonic waves, and the solution is made into aerosol composed of uniform fine particles. When the aerosol is brought into contact with an object, the aerosol particles spread on the surface of the object without agglomeration. After removal of solvent by evaporation, a uniform, extremely thin film of agents is formed on the surface of the object. In the case of a long object, the treatment is accomplished by passing the object through a thin gap extending in the moving direction of the object which is filled with aerosol of high density.

The surfactant which can be used in this invention is a fluorine compound such as fluoroalkyl carboxylate (alkali metal salt, alkaline earth metal salt, amine salt), perfluoroalkyl carboxylate, fluoroalkylphosphate ester, polyoxyethylene-perfluoroalkyl phosphate ester, perfluoroalkyl sulfate ester, polyoxyethylene perfluoroalkyl sulfate ester, perfluoroalkylsulfonamide derivative, perfluoroalkylamine salt, perfluoroalkyl quaternary ammonium salt, perfluoroalkylimidazoline derivative, perfluoroalkylbetaine, polyoxyethylene perfluoroalkyl ether, polyoxyethylene perfluoroalkyl phenol, polyoxyethylene perfluoroalkylamine, and perfluoroalkyl carboxylic acid sorbitan ester. The fluorinated alkyl group should preferably have 6 to 22 carbon atoms. Preferred examples are 16-fluorohexadecyl carboxylic acid, perfluorooctyl carboxylic acid N,N-diethanolamine, perfluorooctyl phosphate ester sodium, perfluorodecyl phosphate ester sodium, polyoxyethylene perfluorooctyl phosphate ester sodium, N-polyoxyethylene-N-ethyl perfluorooctylsulfonamide, N,N-di(polyoxyethylene)-perfluorooctylsulfonamide, N-polyoxyethylene-N-butyl perfluorodecylsulfonamide, N-polyoxyethylene-N-ethylperfluorooctadecylsulfonamide, perfluorodocecyltrimethyl ammonium salt, perfluorooctadecyl-N-ethyldimethyl ammonium salt, perfluorooctadecyl betaine, polyoxyethylene perfluorooctylether, polyoxyethylene perfluorooctadecenyl ether, polyoxyethylene perfluorohexylamine, and perfluorododecyl carboxylic acid sorbitan ester. These surfactants are used individually or in combination.

EXAMPLE 2

Figure 11:
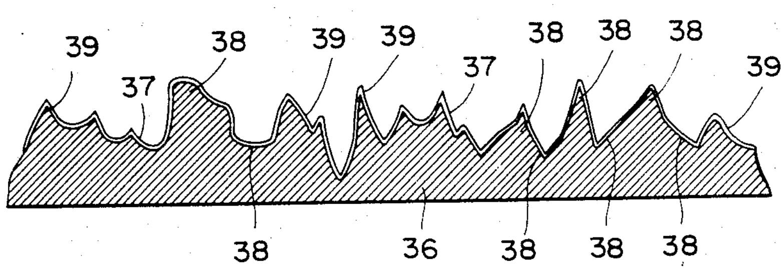
FIG. 11 is an enlarged sectional view showing an irregular surface of a plastics molded item with a thin film in accordance with the invention.

FIG. 11 is an enlarged sectional view of a plastics molded item with surface modification. The surface modification was accomplished by forming an extremely thin film of a surface modifier in the following manner. At first, a surface modifier was dissolved or dispersed in water in a low concentration, and the surface tension of the solution was decreased below 30 dyne/cm at 25° C. by adding a fluorine surfactant. The solution was made into aerosol in the same way as in Example 1. Selected aerosol particles smaller than 5 μm in diameter were applied to the surface of a plastics molded item. The aerosol particles spread over the surface of the molded item without agglomeration. The aerosol particles were so small that water evaporated rapidly, leaving a uniform, extremely thin film of surface modifier, which is thinner than 400 nm, or thinner than the wavelength of visible light. The thin film covers completely the irregularities 38, which are smaller than about 1 μm, on the surface 37 of the molded item 36.

The surface modifier contains an anti-static agent, anti-fogging agent, mildewproofing agent, and the like. Incidentally, the critical surface tension for plastics is as follows: 39 dyne/cm for polyvinyl chloride resin; 31 dyne/cm for polyethylene; 33 dyne/cm for polystyrene; and 39 dyne/cm for polymethyl methacrylate.

Since the extremely thin film 39 of surface modifier is thinner than the wavelength of visible light, the molded item 36 looks intact. This means that the surface modification does not change the clarity of a plastics sheet. Even when rubbed against something, the extremely thin film 39 covering the minute irregularities 38 smaller than 1 μm on the surface 37 of the molded item is partially lost at projections 38, but remains mostly unremoved in concavities. Therefore, the thin film 39 remains continuous, and the effect of the surface modifier remains unchanged. The projecting parts where the thin film 39 has been rubbed off will soon be covered again by the surface modifier which spreads from the surroundings of the projecting parts. In this sense, the surface modifier is superior in abrasion resistance and keeps the surface modification effect such as prevention of static build-up for a long period of time.

According to this invention, the extremely thin film 39 is formed along the minute irregularities 38 on the surface 37 of the plastics molded item 36, and consequently it withstands repeated pressing and peeling e.g. of a pressure sensitive tape. The extremely thin film 39 formed according to the method of this invention is not sticky, unlike conventional films which are formed by coating or incorporation and become sticky due to bleeding or variation of film thickness. The extremely thin film of surface modifier exhibits the same performance for any plastics materials. The surface modifier is used in a very small quantity for the unit area of molded items, and the surface treatment is carried out in a dry process. Thus the method of this invention can be applied to industrial mass production at a low cost.

In this example, the surface modifier was prepared by dispersing 2% of lauryl diethanolamine as an anti-static agent

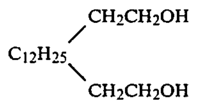

and 0.1% of a fluorine surfactant in water. This aqueous dispersion was made into aerosol with the aid of ultrasonic waves, and aerosol particles smaller than 5 μm were selected. A polyethylene film was exposed to this aerosol. The aerosol particles had a surface tension of 17 dyne/cm which is much lower than the surface tension of polyethylene, 31 dyne/cm. Therefore, they spread in the form of a uniform thin film, which is thinner than the wavelength of visible light, on the surface of the polyethylene film.

EXAMPLE 3

Figure 12:
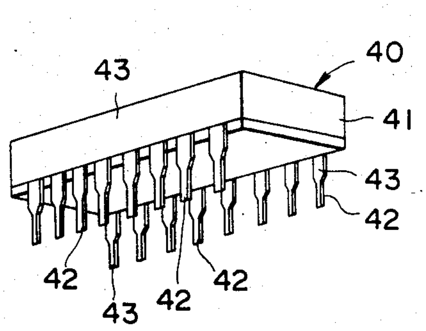
FIGS. 12 and 13 are respective perspective and sectional views of a semiconductor device coded in accordance with the invention.
Figure 13:
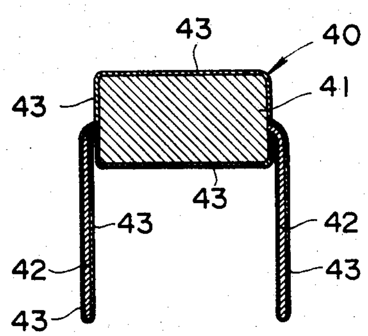
Figure 14:
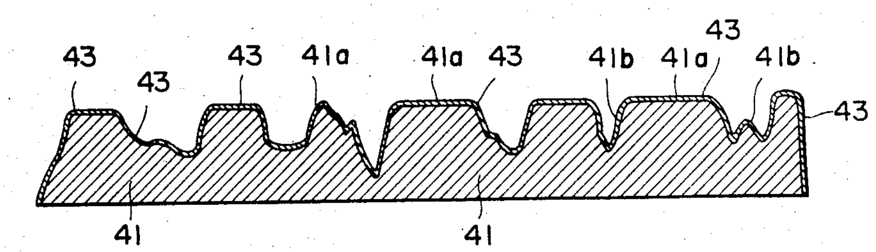
FIG. 14 is a enlarged sectional view showing the surface of the semiconductor device.

In this example, a semiconductor device underwent anti-static treatment according to the method of this invention. In FIGS. 12 to 14, there are shown a semiconductor device 40, a body 41 of the semiconductor device 40 which is covered with plastics such as epoxy resin, a plurality of terminals 42 projecting from both sides of the body 41, and a uniform, continuous extremely thin film 43 of anti-static agent formed on the surface of the body 41 and the terminals 43. This extremely thin film is the same as that formed in Example 1. In other words, the thin film was formed by deposting aerosol particles smaller than 5 μm. The aerosol was produced from a dilute aqueous solution containing a small quantity of anti-static agent and a fluorine surfactant that lowers the surface tension of the solution below 30 dyne/cm. Such aerosol particles do not agglomerate but spread on the surface of the semiconductor device. On rapid evaporation of water, the anti-static agent is left uniformly on the surface of the semiconductor device in the form of an extremely thin film thinner than 400 nm, or the wavelength of visible light.

FIG. 14 is an enlarged sectional view of an extremely thin film 43 formed on the surface 41*a* of a semiconductor device 40. It is to be noted that the extremely thin film 43 covers continuously the minute irregularities 41*b* which are smaller than 1 μm, on the surface 41*a* of the body 41 of the semiconductor device 40.

The semiconductor devices coated as mentioned above do not generate static charge, when placed in a transparent plastics magazine stick, on themselves and the magazine stick. Thus it is not necessary to make the magazine stick conductive. The uniform, continuous extremely thin film 43 formed on the surface of the semiconductor device 40 prevents static build-up when the semiconductor device is rubbed against something. The thin film also keeps its effect over a long period of time. The semiconductor devices which are protected from static build-up do not need countermeasures for preventing static build-up in any stage of production, storage, transportation, and mounting on apparatuses. In addition, the extremely thin film 43 covers the body 41 and terminals 42 of the semiconductor device 40, protecting them from the atmosphere or environment in which the semiconductor device is placed. The extremely thin film 43 covering the terminals 42 does not interfere with connection because it is vaporized in the soldering step. Although the extremely thin film 43 covers the semiconductor device 40 entirely, there is no continuity between the terminals 42 because the extremely thin film 43 has a high resistance ($10^{14}$ ohm/cm by actual measurement) along the surface direction.

In this example, the semiconductor device 40 itself undergoes anti-static treatment with a uniform, continuous extremely thin film 43 which covers the semiconductor device 40 entirely. This thin film prevents static build-up when the semiconductor device comes in contanct with other objects. In addition, this thin film keeps its anti-static effect long, and protects the semiconductor devices from static breakage and misoperation due to static charge.

EXAMPLE 4

Figure 15:
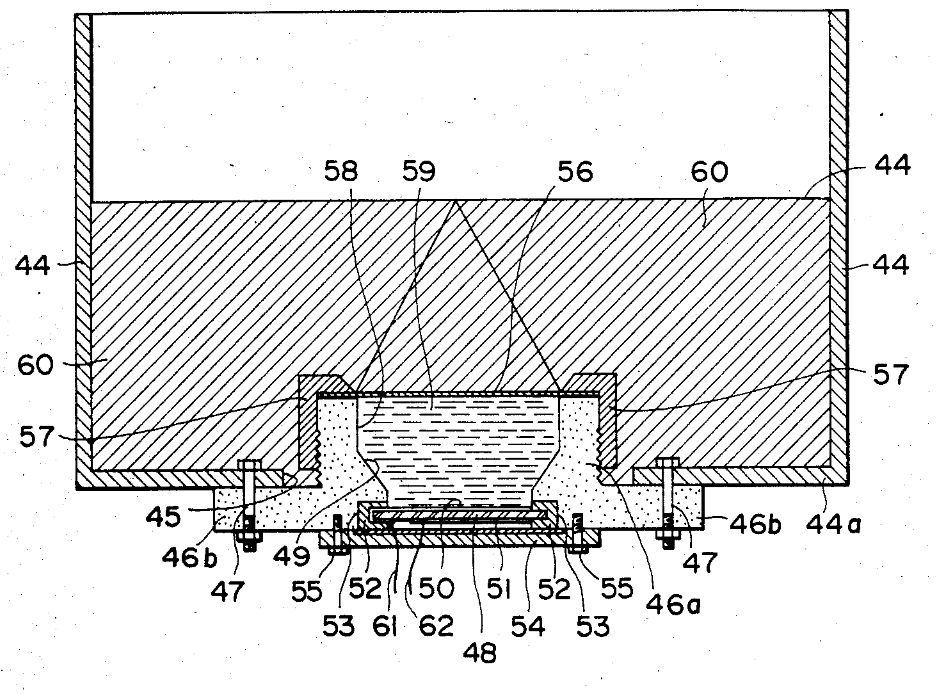
FIGS. 15, 16 and 17 are side sectional views of an apparatus for generating an aerosol using ultrasonic waves in accordance with the invention.

This example relates to an ultrasonic apparatus for producing aerosol. In FIGS. 15 to 19 similar parts have the same number designation. In FIG. 15, there are shown a container proper 44, an opening 45 made on the bottom plate 44*a* of the container proper 44, a vibrator support 46 with a cylindrical body 46*a* inserted in the opening 45 and with a flange 46*b* fastened to the underside of the bottom plate 44*a* with bolts and nuts 47, a vibrator 48 which closes the inner opening 49 of the cylindrical body 46*a* of the vibrator support 46, an electrode 50 provided on the top of the vibrator 48, an electrode 51 provided on the underside of the vibrator 48, a packing 52 provided on the periphery of the vibrator 48 and fitted in the annular recess 53 on the internal wall of the cylindrical body 46*a*, a disklike lid 54 pressed against the underside of the vibrator support 46, screws 55 which fasten the lid 54 to the underside of the vibrator support 46, a vibration transmitter 56 made of a heat-resistant sheet like polyester which is mounted on the upper periphery of the cylindrical body 46*a* of the vibrator support 46 so as to close the circular hole 49, an annular fastener 57 which is screwed to the external thread of the cylindrical body 46*a* of the vibrator support 46 so as to press the external periphery of the vibration transmitter 56 down, a closed chamber 58 enclosed by the vibration transmitter plate 56 and the vibrator 48 at top and bottom and encircled by the cylindrical body 46*a*, a vibration transmitting liquid 59 like pure water which is filled in the closed chamber 58, a solution 60 placed in the container proper 44, and lead wires 60 and 61 connected to the electrodes 50 and 51, respectively.

In operation, electric power is applied to the electrodes 50 and 51 of the vibrator 48, and the vibrator 48 is actuated. This vibration generates ultrasonic waves, which are then transmitted to the solution 60 through the vibration transmitting liquid 59 and the vibration transmitting plate 56. The focus of vibration is formed at the surface of the solution 60 at which aerosol is produced. In this example, it is to be noted that unlike the conventional apparatus in which the electrode is exposed to the solution, the vibrator 48 is placed in the closed chamber 58 filled with the vibration transmitting liquid 59 like pure water which does not adversely affect the electrodes 50 and 51, and the electrodes 50 and 51 are not in direct contact with the solution 60 and are free from deposit of solids or corrosion by the solution 60. Thus the protected electrodes 50 and 51 and vibrator 48 last long.

The vibration transmitting liquid 59 in the closed chamber 58 is composed of pure water and the like. It transmits vibration but does not move, because it is enclosed completely. Therefore, the vibration of the vibrator 48 is transmitted with certainty to the solution 60 through the vibration transmitting liquid 59 and the vibration transmitting plate 56, and stable cavitation takes place. In the conventional apparatus, it takes 5 to 10 minutes before stable cavitation takes place, particularly in the case of viscous liquid. The apparatus of this example provides cavitation instantaneously because the liquid phase on the electrode is fixed as mentioned above. In the conventional apparatus it is often experienced that the jet formed on the surface of the solution fails to disturb the liquid phase on the electrode, making the transmission of ultrasonic waves irregular. This disadvantage is overcome in this example, because the electrodes 50 and 51 are covered by the closed chamber 58. Because of this feature, it is possible to operate a multiplicity of vibrators simultaneously to achieve a high output.

In the conventional apparatus, the electrodes 50 and 51 of the vibrator 48 get overheated when the solution 60 is used up. This advantage is overcome in this example because the electrodes 50 and 51 are covered at all times by the vibration transmitting liquid 59 in the closed chamber 58.

Figure 16:
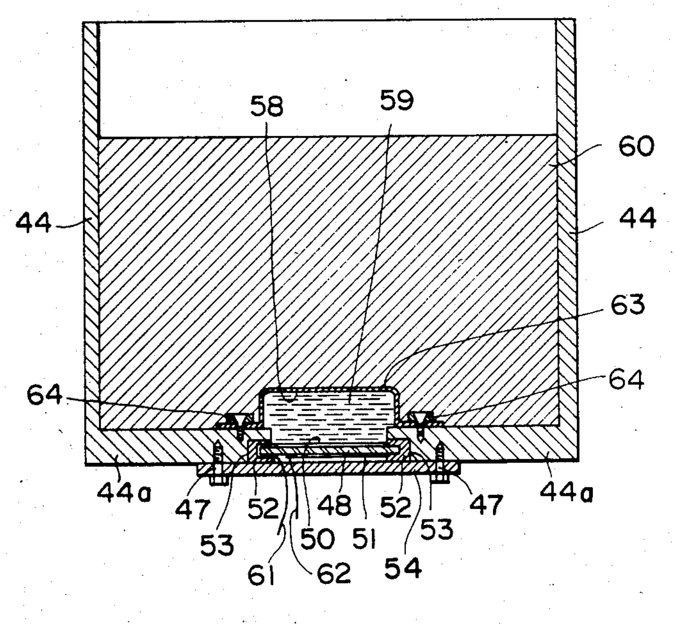

In the apparatus shown in FIG. 16, the vibrator support 46 is replaced by a concave cap 63 made of polyester sheet which is fastened by an annular body 64 so as to form the closed chamber 58 which covers the vibrator 48. The same effect as above can be obtained with this apparatus.

Figure 17:
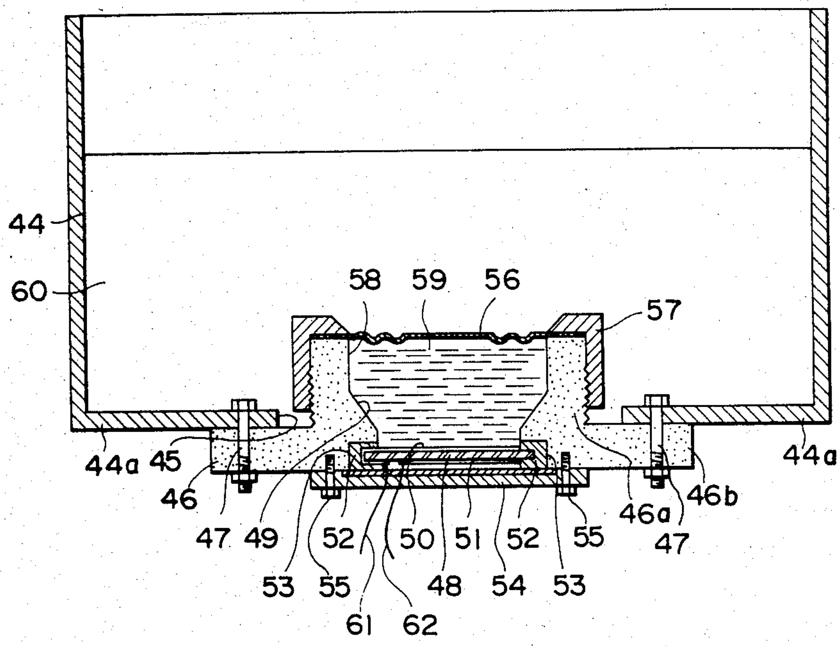

In the apparatus shown in FIG. 17, the flat vibration transmitting plate 56 is replaced by an annularly corrugated vibration transmitting plate 56. The corrugated structure has a great extensibility and transmits vibration with certainty.

Figure 18:
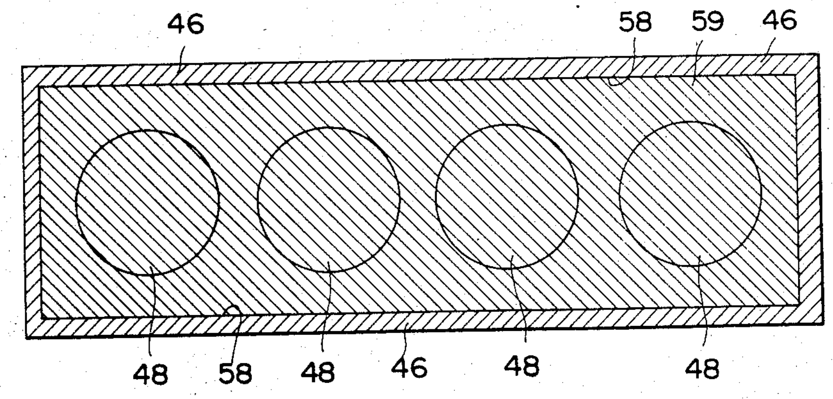
FIG. 18 is a top sectional view of an acoustic wave generator in accordance with the invention.

The apparatus shown in FIG. 18 is provided with a plurality of vibrators 48 in the closed chamber 58 in order to increase the ultrasonic output. As in the above-mentioned apparatus, the vibrator 48 is covered by the vibration transmitting liquid 59 filled in the closed chamber 58 and is isolated from the solution 60 so that the electrodes 50 and 51 of the vibrator 48 are protected.

Figure 19A:
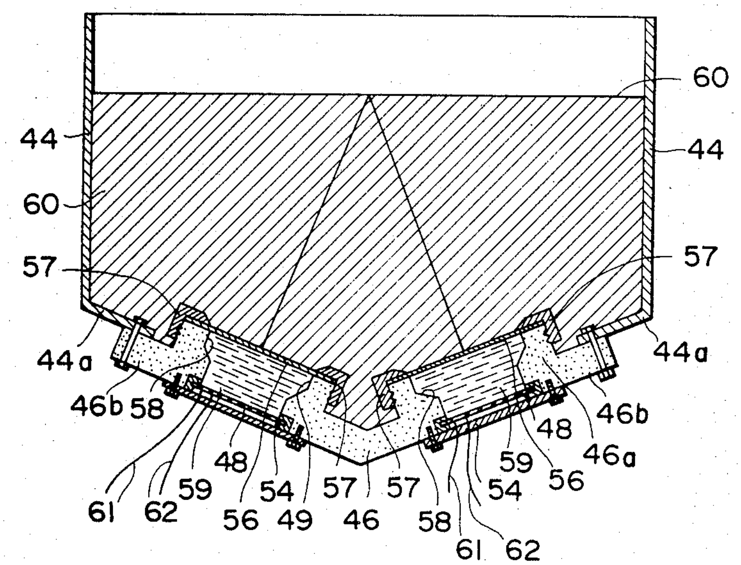
FIGS. 19(A) and 19(B) are respective side sectional and top sectional views of another apparatus in accordance with the invention for generating an aerosol using acoustic waves.
Figure 19B:
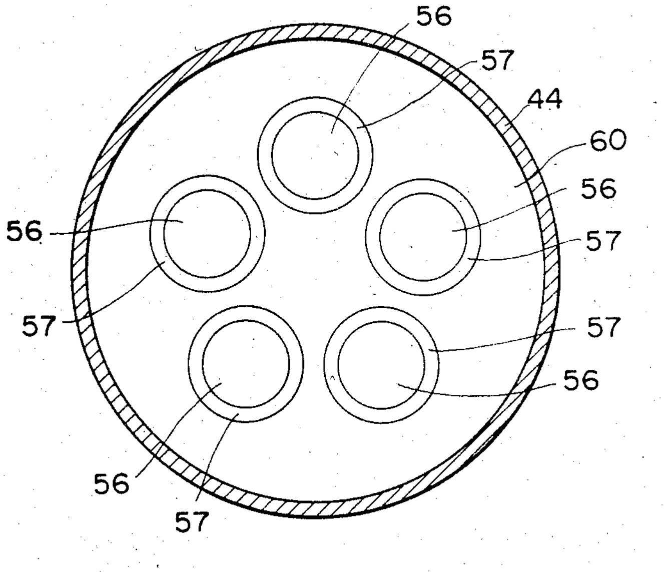

The apparatus shown in FIGS. 19(A) and (B) is characteristic in that the bottom plate 44*a* of the container proper 44 is made conical and provided with a plurality of vibrators 48 on the same circumference, each vibrator 48 being covered with the closed chamber 58, so that the focus of vibration of each vibrator 48 is concentrated at one point on the surface of the solution 60. With this apparatus, it is possible to generate a great output of ultrasonics in addition to the above-mentioned effect.

Incidentally, the above-mentioned vibration transmitting plate 56 is not limited to polyester sheet; but any material can be used so long as it is good in corrosion resistance and heat resistance and does not absorb ultrasonic energy. The vibration transmitting liquid 59 may be pure water containing anti-freeze or any other liquid so long as it does not adversely affect the electrodes 50 and 51 of the vibrator 48.

As mentioned above, the apparatus in this example has a structure in which the vibrator is covered with the vibration transmitting liquid such as pure water filled in the closed chamber so that the vibrator is protected from the solution to ensure a long life and the ultrasonic generated by the vibrator is transmitted certainly and stably through the vibration transmitting liquid.

EXAMPLE 5

This example demonstrates an apparatus for selecting and transferring aerosol particles as shown in FIGS. 20 to 23.

Aerosol particles produced by ultrasonic cavitation vary in size according to the frequency of the ultrasonic energy. Actual aerosol particles, however, are not uniform in size. For instance, aerosol particles produced by ultrasonics of 1 to 2 MHz in the conventional way range in size from 1.5 to 10 μm. This is attributable to the method of transportation of aerosol particles produced by caviation. In the conventional apparatus for transferring aerosol under pressure, the carrying gas transfers undesirable large particles. In the case where a large quantity of aerosol is to be supplied at a high speed, it is necessary to increase the velocity and pressure of the carrier gas. This also gives rise to aerosol of large particles. For these reasons, the conventional method is limited in the quantity and feed speed of aerosol.

These disadvantages are overcome by the apparatus of this example, which sucks aerosol produced by an aerosol generator and transfers it to a proper point of use, while selecting the aerosol particles. This apparatus evacuates the aerosol generator, promoting the production of aerosol, and increases the aerosol transfer speed and the aerosol density.

Figure 20:
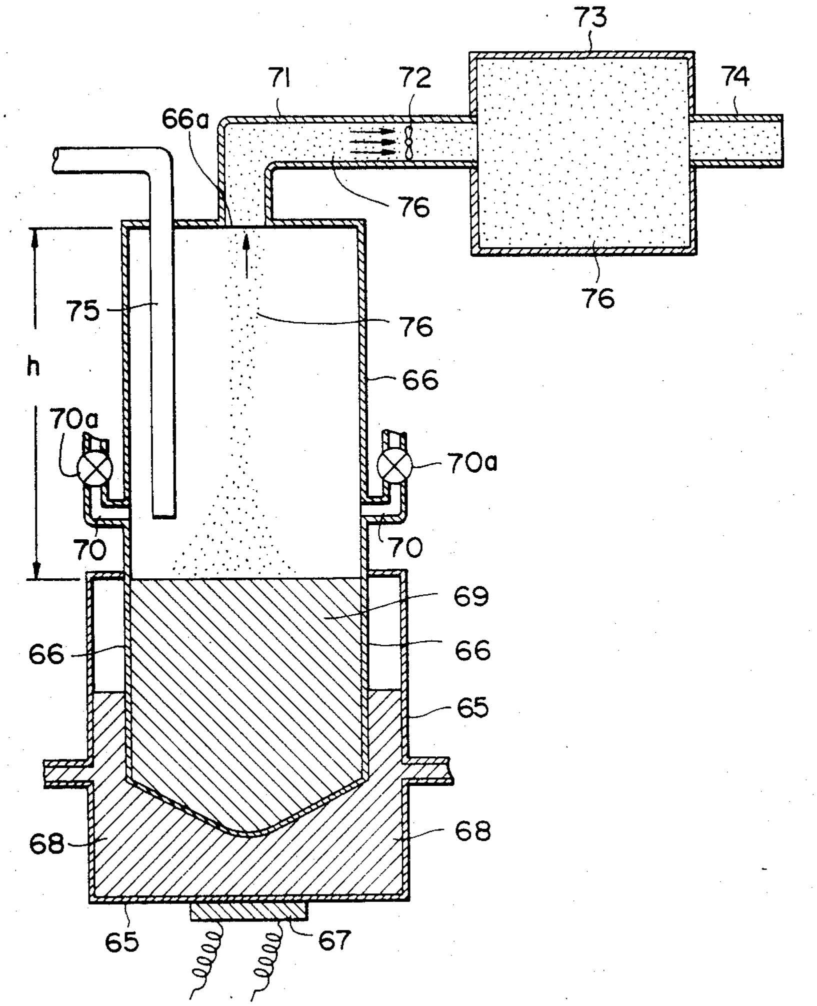
FIG. 20 is a side sectional view of a still further apparatus for generating aerosol in accordance with the invention.
Figure 21:
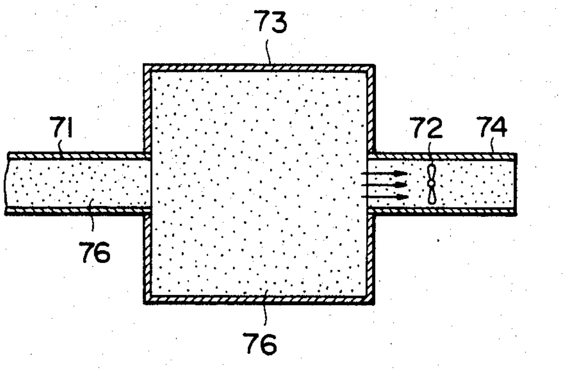
FIG. 21 is a sectional view of an aerosol chamber for treating an object in accordance with the invention.

FIG. 20 shows an ultrasonic aerosol generator, in which there are shown an external container 65, an internal container 66 with its lower part accommodated in the external container 65, a vibrator 67 provided at the bottom of the external container 65, a transmitting medium 68 placed in the external container 65 with an inlet for replenishing, a solution 69 of anti-static agent and the like dissolved in water or other solvent placed in the internal container 66, a gas suction port 70 provided on the side wall of the internal container 66 slightly above the surface of the solution, a pressure regulating valve 70*a* provided on the suction port 70 for adjusting the pressure in the internal container 66, an aerosol transfer duct 71 extending from the outlet 66*a* on the top of the internal container 66, a suction means such as blower 72 provided in the duct 71 for sucking aerosol from the internal container 66, and a treating chamber 73 connected to the duct 71. The treating chamber 73 is provided with an exhaust pipe 74 and a means (not shown) that permits the passage of an object to be treated. The blower 72 may be installed in the exhaust pipe 74 instead of the transfer duct 71. The solution 69 is supplied to the internal container 66 through a feed pipe 75.

The electrically actuated vibrator 67 brings about cavitation that produces aerosol particles 76 on the surface of the solution 69 in the internal container 66. The suction means 72 evacuates the internal container 66. Evacuation promotes the cavitation action and the production of a large quantity of aerosol 76. The sucked aerosol 76 passes through the transfer duct 71 and enters the treating chamber 73, in which an object (not shown) is exposed to the aerosol 76. The aerosol particles 76 spread on the surface of the object, and an extremely thin film of agents is formed after evaporation of the solvent (water). For formation of such a thin film, the aerosol particles should be 1 to 3 μm in size. When the aerosol 76 is sucked by the suction means 72, large aerosol particles fall and small aerosol particles from 1 to 3 μm in size are transferred to the treating chamber 73 through the transfer duct 71. The size of the aerosol particles that reach the treating chamber is determined by the height h from the surface of the solution 69 to the outlet 66*a* of the internal container 66 and by the suction force of the suction means 72. Therefore, the size of the aerosol particles can be selected as desired by adjusting the height h and the suction force.

In the conventional apparatus, aerosol is transferred to a point of use through the transfer duct 71 by pressurizing the internal container 66 with air or a proper gas forced into the container 66 by a blower. Pressure in the container 66 suppresses the production of aerosol by cavitation. According to this invention, however, the internal container 66 is evacuated by suction and this evacuation promotes the production of aerosol by cavitation. Thus it is possible to produce a large quantity of aerosol 76 and to transfer it at a high speed. The pressure in the internal container 66 can be adjusted by the pressure regulating valve 70*a* on the suction port 70 attached to the internal container 66. The above-mentioned arrangement keeps the aerosol density at a certain level and ensures uniform treatment of an object. In the case of suction system like the apparatus of this invention, it is easy to introduce secondary air or gas into the transfer duct through a proper inlet attached to the duct before the suction means 72. The secondary air thus introduced into the treating chamber is useful to adjust the density and velocity of the aerosol and to speed up the evaporation of the solvent.

Figure 22A:
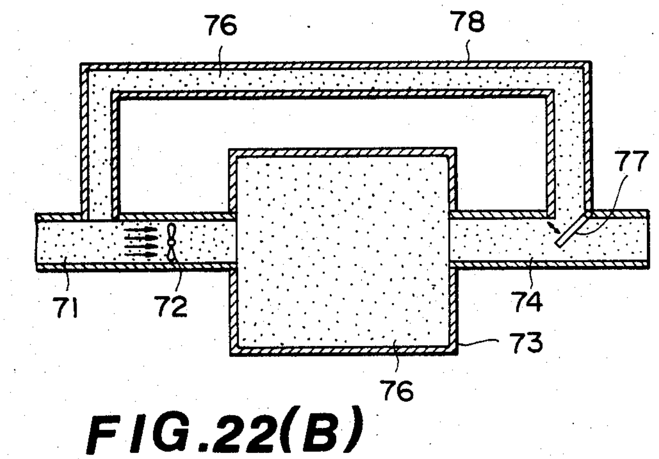
FIGS. 22(A) and 22(B) are sectional views showing an aerosol treatment chamber with a feedback conduit in accordance with the invention.
Figure 22B:
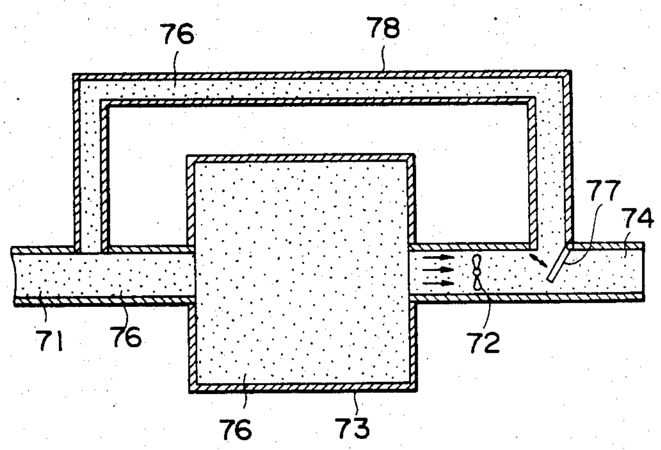

The apparatus in this example may be modified by attaching a feedback valve 77 and a feedback duct 78 as shown in FIGS. 22(A) and 22(B). As the feedback valve 77 is adjusted, the discharge gas containing aerosol 76 is returned through the feedback duct 78 to the internal container 66, the transfer duct 71, or the treating chamber 73. Thus it is possible to adjust the density and velocity of aerosol 76 while keeping the pressure constant in the internal container 66. This is advantageous in that the density and velocity of aerosol particles 76 in the treating chamber 73 can be adjusted without affecting the desirable aerosol particle size. By virtue of this advantage, the apparatus of this example makes it possible to form a uniform, extremely thin film on a film, sheet, or molded item. Aerosol of dilute aqueous solution brings about a cooling effect when the density is high and the supply speed is high, and promotes vaporization due to heat of absorption when the density is low. This occurs only when the aerosol particles are uniform. In this connection, the apparatus of this example is advantageous because it produces fine, uniform aerosol particles.

In the apparatus of this example, the following procedures are used to adjust the size, velocity, and density of aerosol particles.

(1) The size of aerosol particles is adjusted by regulating the opening of the pressure regulating valve 70*a* on the suction port 71, the suction force exerted by the suction means 72, and the height h.

(2) The velocity and density of aerosol 76 in the treating chamber 73 are adjusted by (i) the feedback valve 77 provided in the feedback path 78 or (ii) secondary air or gas.

With the aid of the suction means 72 as mentioned above, it is possible to make the aerosol particles uniform in size and to adjust the velocity and density of aerosol particles very easily.

Figure 23:
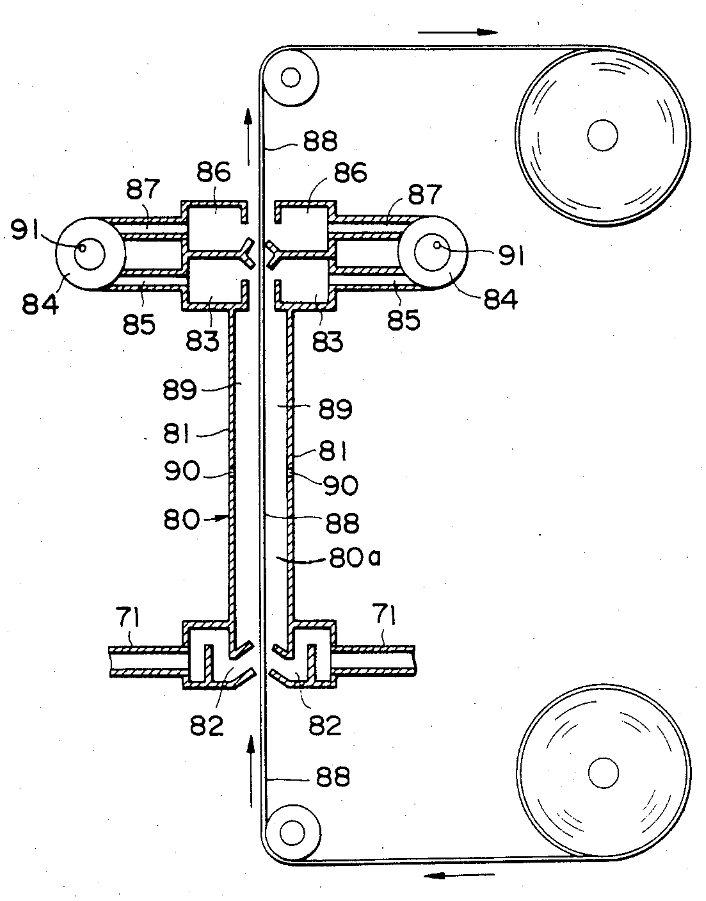
FIG. 23 is a side sectional view of a treatment chamber for elongated objects in accordance with the invention.
Figure 24:
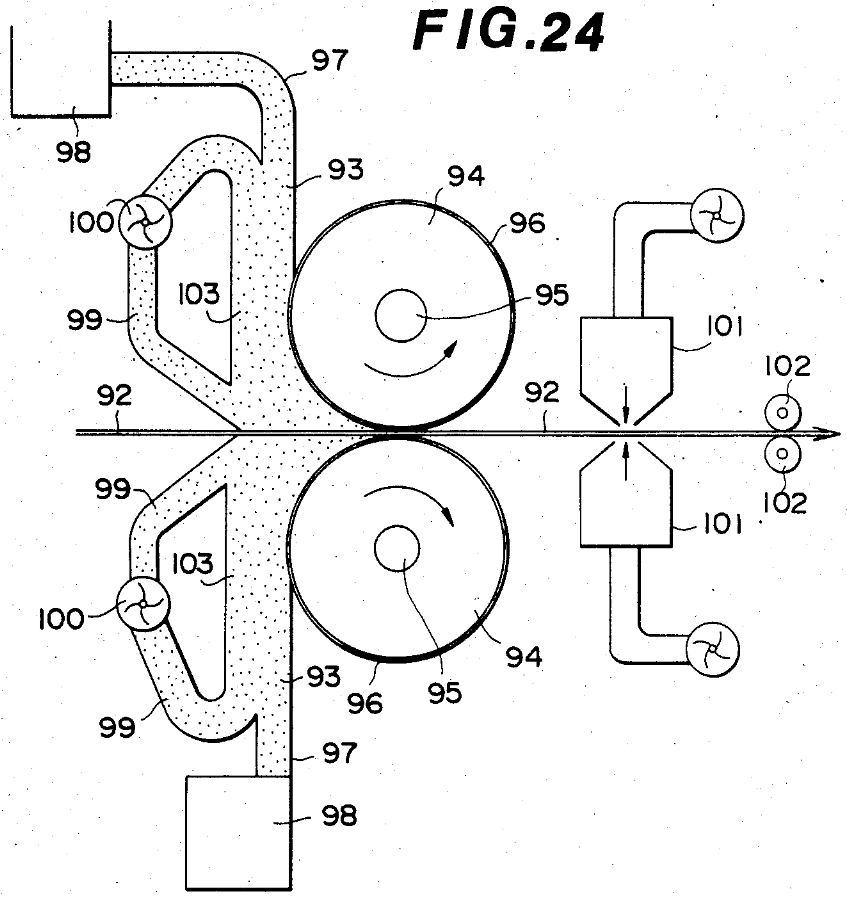
FIG. 24 is a sectional view of an aerosol treatment apparatus in accordance with the invention using transfer rollers.
Figure 25:
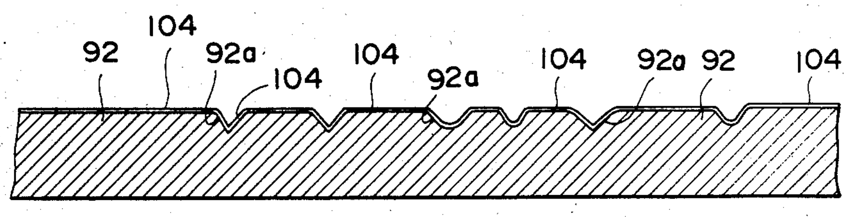
FIG. 25 is an enlarged sectional view of the surface of sheet material with a coating in accordance with the invention.

FIG. 23 shows an apparatus which includes the above-mentioned means for adjusting the particle size, velocity, and density of aerosol. This apparatus is designed to treat a flat object like film or sheet. In FIG. 23, there are shown a thin square body 80 having a thin hollow space 80*a* enclosed by a pair of internal walls 81 facing each other, a manifold 82 attached to the lower end of the thin square body 80 and in communication with the thin hollow space 80*a* and a transfer duct 71, a suction chamber 83 placed atop of the thin square body 80 in communication with the thin hollow space 80*a* and a suction pipe 85 of a suction means 84 comprising a blower etc., and an exhaust chamber 86 connected to the suction means 84 and an exhaust pipe 87, the exhaust chamber 86 opening toward the film 88 which passes through the thin hollow space 80*a* in the thin square body 80.

The apparatus of this example receives aerosol from the aerosol generator as mentioned above. Aerosol 76 is sucked by the suction means 84 and introduced into the hollow space 80*a* through the transfer duct 71 and the manifold 82. Aerosol 76 rises in the thin gaps 89 formed by the film 88 and the internal walls of the thin hollow space 80*a* as the film 88 rises. Thus the aerosol 76 fills the gaps 89. The film 88 is exposed to the aerosol 76 while it travels through the gaps 89. The aerosol 76 which has not deposited on the film 88 is diluted with secondary air introduced from a hole 90 made on the internal wall 81 and then sucked by the suction means 84. The aerosol 76 is further diluted with tertiary air introduced from an air hole 91 on the suction means 84. The diluted aerosol is fed into the exhaust chamber 86 and directed to the film 88 to dry the extremely thin film formed on the film 88.

In the apparatus of this example, the thin gap 89 permits the suction of aerosol 76 by the suction means 84 to go along with the movement of aerosol caused by the travel of the film 88. This arrangement permits aerosol 76 to deposit on the film 88 uniformly in a short time. The secondary and tertiary air dilute the aerosol rapidly, dry the aerosol, and keep the aerosol in the apparatus. With the aid of this apparatus, it is possible to transfer a large quantity of aerosol at a high speed and to adjust the density and velocity of aerosol easily by introducing secondary and tertiary air. The exhaust pipe 84 may be connected to a water bath so that aerosol in the exhaust gas is trapped completely. This will help keep the working environment clean.

The apparatus of this example may be used for aerosol produced by an atomizer as well as an ultrasonic generator.

As mentioned above, according to this example, it is possible to select aerosol particle size as required and transfer aerosol by sucking the aerosol produced in the aerosol generator. In addition, the aerosol generator is evacuated so as to promote the production of aerosol, and the transfer speed and density of aerosol can be adjusted easily.

EXAMPLE 6

The method for forming a thin film of anti-static agent and the like on an object is embodied by the apparatus as shown in FIGS. 24 to 28, in which there are shown a sheetlike object 92 being fed from one side to another by a proper drive unit, treating chambers 93 covering the upper side and underside of the object 92, transfer rolls 94, each forming one side of each treating chamber 93, shafts 95 of the transfer rolls 94, adsorption layers of Teflon 96 formed on the transfer rolls 94, said adsorption layer having a lower surface tension than that of the object 92, transfer ducts 97 for supplying aerosol from aerosol generators 98, feedback pipes 99 connecting the vicinity of the entrance for the object 92 and the vicinity where each transfer duct 97 is connected to the aerosol generator, blowers 100 provided on the feedback pipes 99, said blowers sucking aerosol from the aerosol generator 98 and supplying it to the treating chambers 93, driers 101 for drying the upper side and underside of the object 92 which emerges from the treating chamber 93, and take-up rolls 102 which discharge the treated object 92.

In operation of this apparatus, aerosol 103 is produced by the aerosol generator 98 from a dilute aqueous solution or dispersion of anti-static agent containing a fluorine surfactant that lowers the surface tension of the solution below that of the object 92. The aerosol is introduced into the treating chamber 93 through the transfer duct 97 by the blower 100. A portion of the aerosol 103 is returned to the treating chambers 93 again through the feedback pipes 99. Thus the treating chambers 93 are filled with aerosol 103 of high density. Since the adsorption layers 96 on the transfer rolls 94 in the treating chambers 93 have a surface tension lower than that of the object 92, the aerosol 103 sticks to the adsorption layers 96. As the transfer rolls 94 turn, a uniform layer consisting of aerosol particles 103 is formed on the adsorption layers 96. Simultaneously, aerosol particles 103 in the treating chamber 93 stick to the object 92 by the effect of static charge generated on the surface of the object 92. As the result, the static charge on the surface of the object 92 is eliminated. As the object 92 moves forward and comes to be nipped by the transfer rolls 94, the aerosol particles on the adsorption layers 96 of the transfer rolls 94 are pressed against and transferred to the object 92, because the surface tension of the aerosol particles 103 is lower than that of the object 92. The transferred aerosol particles do not agglomerate on the object but spread uniformly. As the object 92 passes through the driers 101, water in the aerosol particles 103 evaporates, leaving a uniform, continuous extremely thin film 104 of anti-static agent on the object 92.

The extremely thin film 104 is 0.01 to 0.2 μm thick if the aerosol is made from a solution containing several percent of anti-static agent.

According to this example, aerosol particles 103 are caused to stick to the transfer rolls 94 once and then transferred to the object 92 by pressing the transfer rolls 94 against the object 92. This permits aerosol particles to deposit on the object 92 rapidly. In addition, the transfer of aerosol particles is performed uniformly without being affected by static charge because static charge on the object 92 has previously been eliminated by depositing aerosol particles 103 directly on the object 92. Aerosol particles 103 have the lowest surface tension; the adsorption layer 96 comes next; and the object 92 has the highest surface tension among the three. Therefore, the aerosol particles 103 deposited on the transfer rolls 94 are easily transferred to the object 92 when pressed and the aerosol particles on the object are not peeled off even when the transfer rolls 94 are pressed against the object 92 under high pressure.

In the conventional transfer method by dipping or roll coating, the solution agglomerates on the transfer roll, making it difficult to form a uniform layer. However, according to this example, aerosol particles 103 are deposited on the smooth adsorption layers 96 of the transfer rolls 94 and a uniform, extremely thin film is formed easily on the adsorption layer of the transfer roll 94. The adsorption layers 96 of the transfer rolls 94 are smooth and simple in structure, and nothing is in contact with them except the object 92 to be treated. The width and thickness of aerosol 103 to be deposited on the adsorption layers can be controlled easily. The apparatus of this example can be applied to aqueous solutions or dispersion of any composition from which aerosol is produced. For the apparatus of this example, the size of aerosol particles is not specifically limited; but the size from 1 to 10 μm is preferred. Aerosol particles of such small size do not stick easily in the conventional method; but they stick easily in this example because they are pressed down by force.

According to the conventional method, it took a long time to cover with aerosol particles minute irregularities smaller than 1 [m on an object to be treated. However, transfer of aerosol particles by the transfer rolls 94 in this example makes it easy to cover the minute irregularities 92*a* with an extremely thin film 104 of desired agents.

In the above-mentioned example, a pair of transfer rolls 94 are provided; but one of them may be omitted if only one side of an object is to be treated. On the other hand, more than one pair of transfer rolls 94 may be provided to facilitate the formation of more uniform continuous thin film 104. In the case where the solution that forms an extremely thin film 104 has a high viscosity, transfer of aerosol particles 103 from the transfer rolls 94 is facilitated when there is a slight difference between the revolving speed of the transfer rolls 94 and the travelling speed of the object 92. Transfer of aerosol particles 103 from the transfer rolls 94 is also facilitated by vibrating the transfer rolls 94. The object 92 to be treated includes any flat products or any products that can be made flat such as plastics films, sheets, boards, sponges, cloths, textiles, and synthetic paper.

Figure 26:
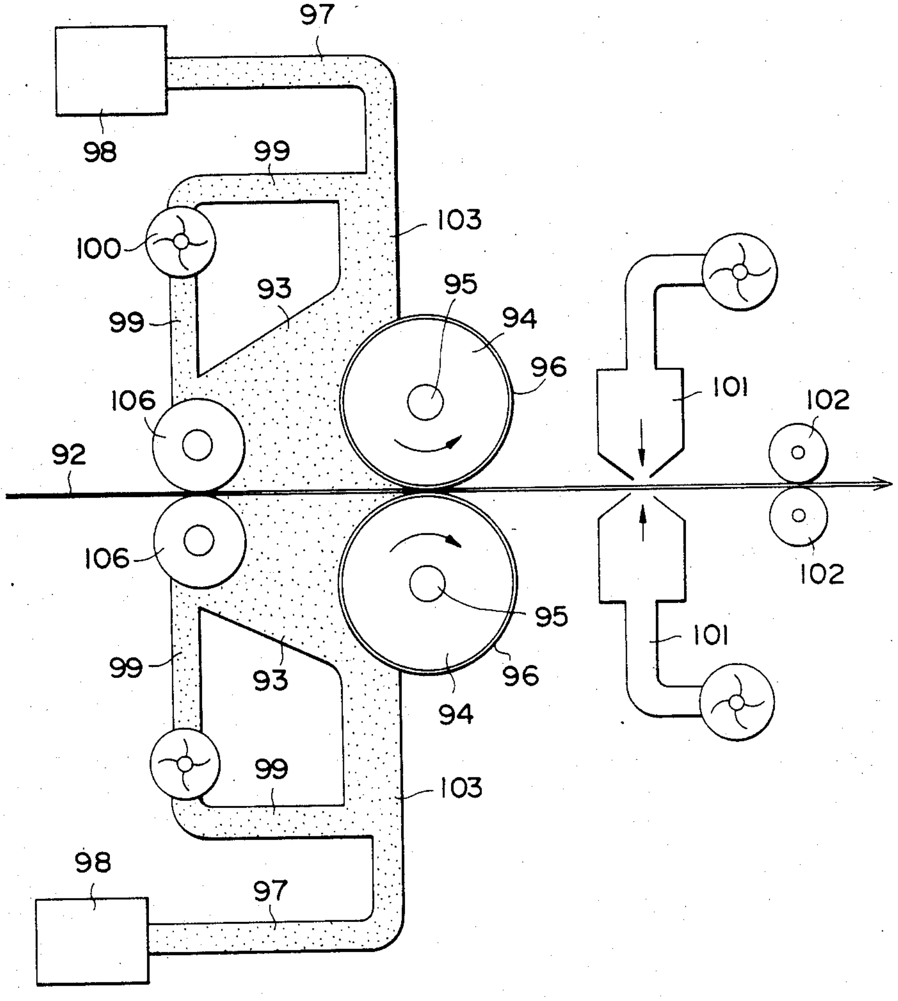
FIG. 26 is a view similar to FIG. 24 showing an apparatus including a pressing roller for pressing the air from the spaces in an object to be coated.
Figure 27:
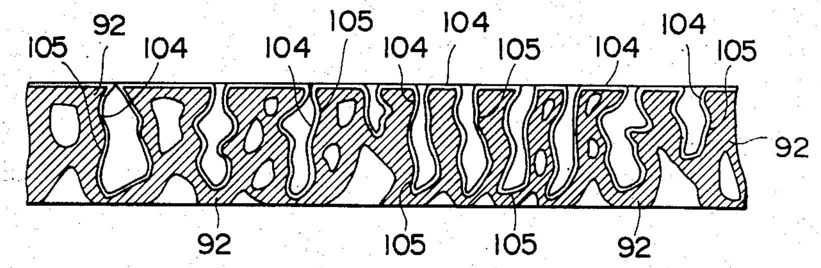
FIGS. 27 and 28 are enlarged sectional views through an object to be coated having internal spaces therein.
Figure 28:
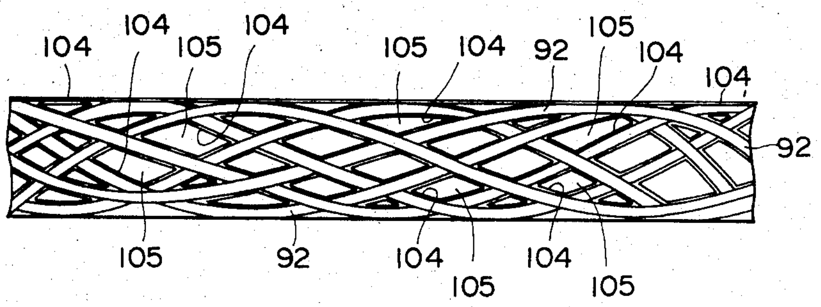

In the case where the object 92 is a sponge, textile, and the like which has internal spaces 105 that communicate with the surface, aerosol particles 103 deposit on the external fibers but do not infiltrate into the inside. This problem can be solved by the arrangement as shown in FIG. 26, in which a pair of pressing rolls 106 are installed before the transfer rolls 94. When an object is passed between the pressing rolls, air in the internal spaces of the object is squeezed out, and on leaving the pressing rolls, the object 92 restores to the original shape, sucking aerosol particles 103 into the internal spaces 105. This is depicted in FIGS. 27 and 28, in which the extremely thin film 104 is formed on the walls of the internal spaces 105 of the object 92. As the object 92 is passed through the transfer rolls 94, the extremely thin film 104 is formed on the surface of the object 92. The infiltration of aerosol 103 into the internal spaces 105 can be adjusted by regulating the compression of the object 92 by the pressing rolls 106.

According to this example, aerosol particles are caused to stick to the transfer rolls once and then transferred to the object by pressing the transfer rolls against the object. This permits aerosol particles to deposit on the object rapidly in the form of an extremely thin, continuous film. In addition, this method can be used in line with the printing or lamination process for mass production at low cost.

EXAMPLE 7

Figure 29:
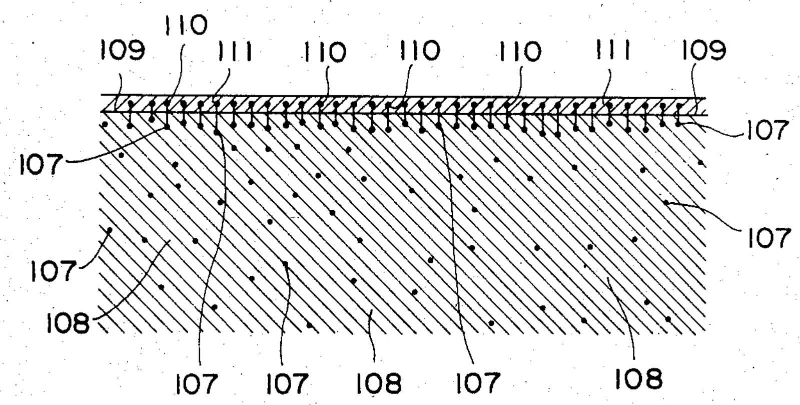
FIG. 29 is a sectional view showing an object having a coating thereon and impregnated with an agent which is common with an agent with an agent in the coating.

This example is concerned with a plastics molded item with a coating film formed thereon with high bond strength. FIG. 29 illustrates the example. The surface 109 of a plastics molded item 108 incorporated with a small quantity of anti-static agent 107 is coated with an extremely thin film 111 of an anti-static agent 110 which contains an anti-static agent of the same type as the aforesaid anti-static agent. Since the anti-static agent incorporated in the molded item is of the same type as the anti-static agent coated on the molded item, they attract each other and the extremely thin film 111 of anti-static agent sticks firmly to the surface 109 of the molded item 108. Since the extremely thin film 111 of anti-static agent 110 is uniform and continuous, anti-static effect is produced immediately and the anti-static agent 110 incorporated into the molded item 108 bleeds slowly to the surface 109. The bleeding anti-static agent 110 contributes only a little to the anti-static effect, but the bleeding increases the concentration of anti-static agent 107 on the surface 109 and in the resin layer just below the surface 109 of the molded item 108. As the result, greater attraction occurs between the anti-static agent 110 of the extremely thin film 111 and the anti-static agent 107 incorporated in the molded item 108, making the continuous, uniform extremely thin film 111 more stable. This thin film sticks with van der Waals force (intermolecular attraction) and does not peel off easily when rubbed against something. For example, an anti-static agent applied to the surface of a polyethylene molded item incorporated with 0.1% of anti-static agent of the same type withstood more than 50 times of rubbing with a cotton cloth under a pressure of 40 g/$cm^2$.

The plastics molded item 108 of this example exhibited anti-static effect immediately after coating and kept the effect for a long period of time. Unlike the conventional incorporation method, the anti-static agent 107 to be incorporated as an anchor is very small in quantity, e.g., 0.05 to 0.3%, which is comparable with 1 to 3% in the conventional method. Thus, the molded item 108 is not affected by the anti-static agent incorporated therein, with respect to heat resistance, clarity, hardness, toxicity to human bodies, etc.

The principle used in this example can be applied to not only anti-static agent but also anti-fogging agent, anti-corrosive agent, mildewproofing agent, and other surface modifiers.

As mentioned above, this example is not a mere combination of incorporation method and coating method. According to this example, a modifier is coated on a molded item and a small quantity of another modifier of the same type as above is incorporated in the molded item. The incorporated modifier attracts the coated modifier, playing a role of anchor. Thus the extremely thin film of modifier formed on the molded item sticks firmly to the molded item. This film is continuous and uniform, and exhibits the surface modification effect immediately after coating and keeps this effect for a long priod of time.

What is claimed is:

1. An apparatus for the surface treatment of an elongated film with an aerosol, comprising:

a pair of spaced apart facing walls defining an aerosol chamber therebetween, said walls being elongated in a direction travel of the film, said aerosol chamber having an inlet end for receiving film to be surface treated and an opposite outlet end for discharging film after it has been treated;

an ultrasonic aerosol generator having an aerosol solution chamber for carrying a supply of aerosol solution and an ultrasonic vibrator operatively connected to said aerosol solution chamber for passing ultrasonic waves through said aerosol solution chamber to form an aerosol in said aerosol solution chamber;

an aerosol duct connected between said aerosol solution chamber and said aerosol chamber adjacent said inlet end of said aerosol chamber for supplying an aerosol into said aerosol chamber from said aerosol solution chamber;

a suction chamber communicating with said aerosol chamber adjacent said outlet end thereof for drawing aerosol from said aerosol chamber;

suction means connected to said suction chamber for drawing aerosol from said suction chamber to cause aerosol to move into said aerosol chamber from said aerosol duct;

an exhaust chamber communicating with said aerosol chamber adjacent said outlet end of said aerosol chamber and downstream of said suction chamber in the direction of movement of the film through said aerosol chamber; and an exhaust pipe connected between said suction means and said exhaust chamber for discharging aerosol from said suction means to said exhaust pipe through said exhaust chamber into said aerosol chamber adjacent said outlet thereof;

at least one of said walls including a secondary air hole for entry of air into said aerosol chamber intermediate said inlet and outlet ends thereof.

2. An apparatus according to claim 1, including a tertiary hole in said suction means for admitting air into said suction means for admixing with aerosol being moved by said suction means from said suction chamber to said exhaust chamber.

3. An apparatus according to claim 2, wherein said aerosol generator comprises an aerosol solution container defining said aerosol solution chamber and for containing a supply of aerosol solution having an upper level, said container having an opening at a bottom thereof, a vibrator support mounted in said opening, said vibrator support defining a vibrator liquid space, a vibrator transmitter connected to said vibrator support and forming a diaphragm covering said vibrator liquid space and separating said vibrator liquid space from said aerosol solution chamber, a vibrator liquid filling said vibrator liquid space, a vibrator covering said vibrator liquid space on a side of said vibrator liquid space opposite from said transmitter, electrodes connected to said vibrator for applying ultrasonic signals to said vibrator to vibrate said vibrator to form ultrasonic waves which pass through said vibrator liquid and to said transmitter for applying the ultrasonic waves to the aerosol solution in said aerosol solution chamber.

4. An apparatus according to claim 3, wherein said vibrator support comprises a flange portion connected to said container and a cylindrical body connected to said flange portion and extending through said opening into said container, said vibrator liquid space being defined in said cylindrical body with said transmitter being connected to one end of said body and said vibrator being connected to an opposite end of said body.

5. An apparatus according to claim 4 including an annular fastener engaged over said cylindrical body and engaged against said vibrator transmitter for holding said vibrator transmitter against said cylindrical body.

6. An apparatus according to claim 5 wherein said vibrator transmitter is corrugated.

7. An apparatus according to claim 5, wherein said container has a conical bottom through which said opening extends, said transmitter and said vibrator lying in parallel planes which extend at an angle to a vertical direction, said container having side walls extending in the vertical direction so that ultrasonic waves pass to the surface of aerosol solution in said aerosol solution chamber at an angle to the vertical direction.

* * * * *